United States Patent
Lai et al.

(10) Patent No.: US 7,874,716 B2
(45) Date of Patent: Jan. 25, 2011

(54) ILLUMINATION DEVICE

(75) Inventors: Chih-Ming Lai, Miao-Li Hsien (TW); Chih-Chung Tsao, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 164 days.

(21) Appl. No.: 12/242,599

(22) Filed: Sep. 30, 2008

(65) Prior Publication Data
US 2009/0268446 A1 Oct. 29, 2009

(30) Foreign Application Priority Data
Apr. 23, 2008 (CN) .................. 2008 1 0301268

(51) Int. Cl.
F21V 7/04 (2006.01)
F21V 33/00 (2006.01)
F21L 4/00 (2006.01)

(52) U.S. Cl. .................. 362/613; 362/628; 362/157; 362/234

(58) Field of Classification Search .................. 362/600, 362/602, 612, 623, 624, 627, 147, 183, 234, 362/606, 611, 616; 52/28
See application file for complete search history.

(56) References Cited

U.S. PATENT DOCUMENTS

| | | | | |
|---|---|---|---|---|
| 4,173,494 A | * | 11/1979 | Johnson et al. | 136/250 |
| 4,663,495 A | * | 5/1987 | Berman et al. | 136/248 |
| 2004/0004827 A1 | * | 1/2004 | Guest | 362/31 |
| 2004/0040228 A1 | * | 3/2004 | Emde et al. | 52/173.3 |
| 2007/0247869 A1 | * | 10/2007 | Lang et al. | 362/612 |
| 2008/0198584 A1 | * | 8/2008 | Fouraux et al. | 362/147 |
| 2010/0002169 A1 | * | 1/2010 | Kuramitsu et al. | 349/65 |

FOREIGN PATENT DOCUMENTS

| | | | |
|---|---|---|---|
| CN | 1379838 A | | 11/2002 |
| DE | 4230726 A1 | * | 3/1994 |
| WO | WO 2008010593 A1 | * | 1/2008 |

* cited by examiner

Primary Examiner—Jong-Suk (James) Lee
Assistant Examiner—David R Crowe
(74) Attorney, Agent, or Firm—Andrew C. Cheng

(57) ABSTRACT

An illumination device includes a light-pervious substrate, a solid-state light source and at least one solar cell. The substrate has a bottom surface, a light incident surface adjacent to the bottom surface, and a light emitting surface opposite to the bottom surface. The solid-state light source is arranged on the light incident surface for emitting light into the substrate through the light incident surface. The at least one solar cell is arranged on the bottom surface of the substrate to absorb and convert solar energy into electric energy and supply the electric energy to the solid-state light source.

10 Claims, 4 Drawing Sheets

ILLUMINATION DEVICE

BACKGROUND

1. Field of the Invention

The present invention generally relates to illumination devices, and particularly to an illumination device includes solar cell cooperated with light emitting diodes.

2. Description of related art

Photovoltaic devices, i.e., solar cells, are capable of converting solar energy into usable electric energy. The energy conversion occurs as the result of what is known as the photovoltaic effect. Solar light impinging on the solar cell and absorbed by an active region of semiconductor material generates electricity.

The solar cell offers a clean and effectively inexhaustible source of energy for lamps, such as light emitting diodes, to provide indoor illumination. However, the solar cell in conventional technology has difficulty in cooperating with the light emitting diodes. Such characteristic minimizes its acceptability in applications.

What is needed, therefore, is an illumination device which can overcome the above shortcomings.

SUMMARY

An illumination device includes a light-pervious substrate, a solid-state light source and at least one solar cell. The substrate has a bottom surface, a light incident surface adjacent to the bottom surface, and a light emitting surface opposite to the bottom surface. The solid-state light source is arranged on the light incident surface for emitting light into the substrate through the light incident surface. The at least one solar cell is arranged on the bottom surface of the substrate to absorb and convert solar energy into electric energy and supply the electric energy to the solid-state light source.

Other advantages and novel features of the present illumination device will become more apparent from the following detailed description when taken in conjunction with the accompanying drawings, in which:

BRIEF DESCRIPTION OF THE DRAWINGS

Many aspects of the present illumination device can be better understood with reference to the following drawings. The components in the drawings are not necessarily drawn to scale, the emphasis instead being placed upon clearly illustrating the principles of the present illumination device. Moreover, in the drawings, like reference numerals designate corresponding parts throughout the several views.

DETAILED DESCRIPTION OF EMBODIMENTS

Figure 1:
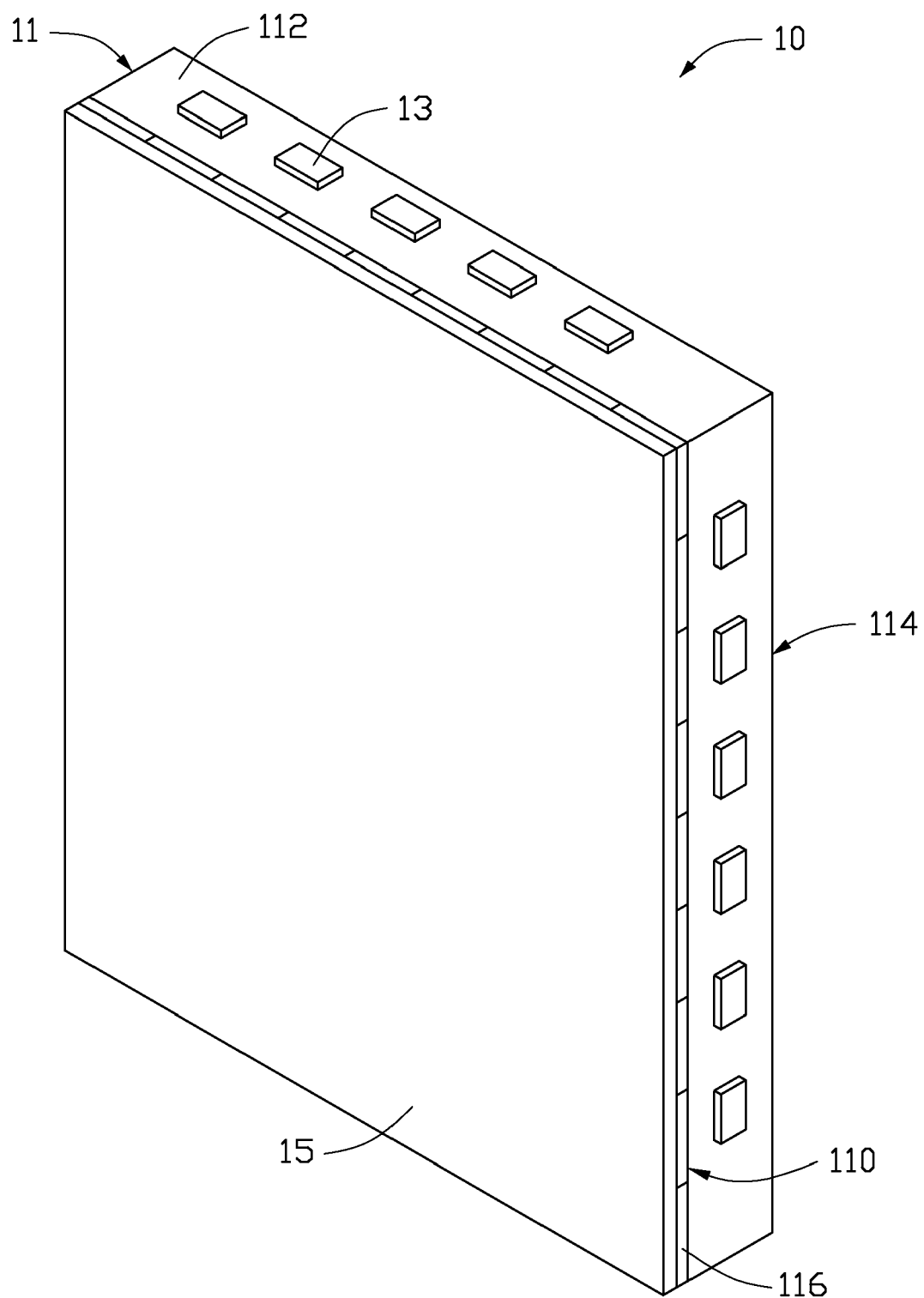
FIG. 1 is a schematic view of an illumination device, in accordance with a first embodiment.

Referring to FIG. 1, an illumination device 10, in accordance with a first embodiment, includes a light-pervious substrate 11, a plurality of solid-state light sources 13, and a solar cell 15.

The substrate 11 includes a bottom surface 110, four light incident surfaces 112, and a light emitting surface 114. The light incident surfaces 112 are adjacent to the bottom surface 110. The light emitting surface 112 is opposite to the bottom surface 110. The substrate 11 is made of light-pervious materials, such as glass or plastic selected from a group consisting of polymethylmethacrylate (PMMA), poly carbonate, and silicone The solid-state light sources 13 can be light emitting diodes. The light emitting diodes 13 are cooperated with the solar cell 15 through the substrate 11. That is, the light emitting diodes 13 are arranged on the light incident surfaces 112 of the substrate 11, and the solar cell 15 are positioned on the bottom surface 110 of the substrate 11.

The illumination device 10 further includes a plurality of transparent conductive films 116, such as indium tin oxide (ITO), or Indium Zinc Oxide (IZO). The transparent conductive films 116 are formed on the bottom surface 110 by semiconductor process. The solar cell 15 is used to convert light into usable electric energy, and fixed to the substrate 11 by the transparent conductive films 116. The transparent conductive films 116 can be used to electrically connect the solar cell 15 to an electricity storage (not shown), such as a storage battery. Thus, when the solar cell 15 converts light into electric energy, the electric energy can be stored in the electricity storage. Moreover, the electric energy can be used to supply power to the light emitting diodes 13.

The solar cell 15 is light-pervious, and can be a silicon-based solar cell made of single crystal silicon, poly silicon or amorphous silicon. A material used for the solar cell 15 can also be selected from a group consisting of subgroup III-V semiconductor compounds, such as AlAs, InAs, InP, GaP, GaAs, GaN, and copper indium gallium selenide (CIGS), copper indium selenide (CIS), cadmium-tellurium (CdTe), organic material and dye-sensitized material, etc. Preferably, a thickness of the solar cell 15 is less than 300 μm. That is, the solar cell 15 is a thin film solar cell.

The solid-state light sources 13 and the solar cell 15 can form a protective film, such as a resin film thereon, to provide waterproof and dustproof functions.

The illumination device 10 can be used as a window of a building. The bottom surface 110 of the substrate 11 is positioned to face outdoors, with the light emitting surface 114 positioned to face indoors. Therefore, light can traverse through the solar cell 15 and the substrate 11, to offer natural lighting for the building. And at the same time, the solar cell 15 absorbs and converts the light into electric energy. The electric energy is stored in the electricity storage. When the electric energy is applied to the light emitting diodes 13 in dark night, the light emitting diodes 13 emit light into the substrate 11 through the light incident surfaces 112. The light is further optically conducted (e.g., traversed and reflected) to transmit out through the light emitting surface 112, to offer indoor illumination. It is to be understood, that the light emitting surface 114 of the substrate 11 can form microstructures, such as V-cuts or printing dots thereon, thus the light traversing out through the light emitting surface 112 is uniform.

It should be noted that the illumination device 10 is not limited to have the above-mentioned first embodiment, the illumination devices described in below embodiments, are acceptable as well.

Figure 2:
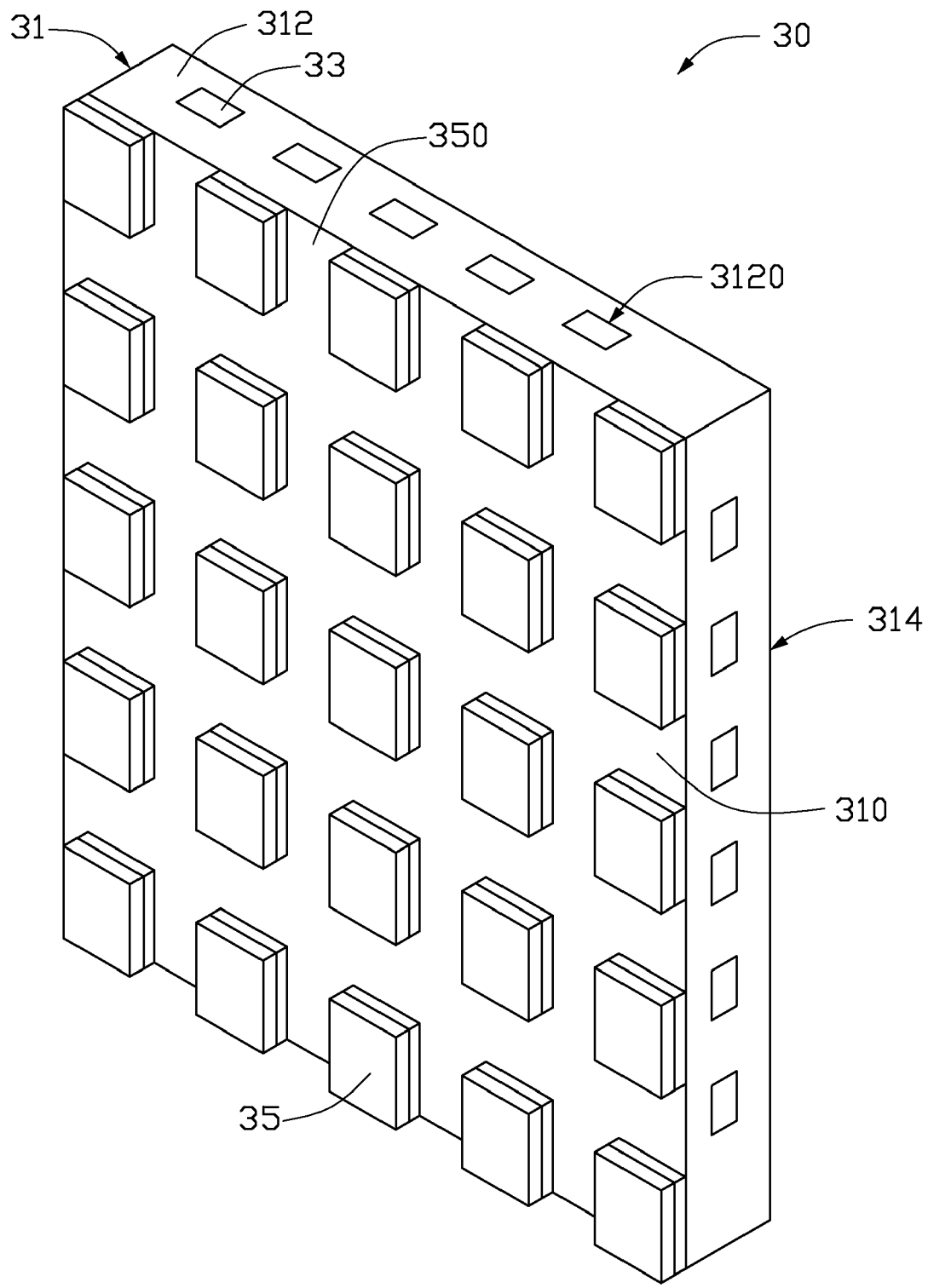
FIG. 2 is a schematic view of an illumination device, in accordance with a second embodiment.

FIG. 2 shows an illumination device 30, in accordance with the second embodiment, differing from the illumination device 10 in the inclusion of a plurality of solar cells 35, and a plurality of receiving recesses 3120 defined on the light incident surfaces 312 receiving the light emitting diodes 33.

In present embodiment, the plurality of solar cells 35 are spaced apart from each other on the bottom surface 310, and spaces 350 between each two solar cells 35 are to allow total transmission of light through the substrate 31, thus increasing natural lighting indoors. In alternative embodiment, the light emitting surface 314 may have a bright enhancement film (BEF) formed thereon. Provision of the bright enhancement film decreases reflection of light on the light emitting surface 314, thus further increasing natural lighting indoors.

Figure 3:
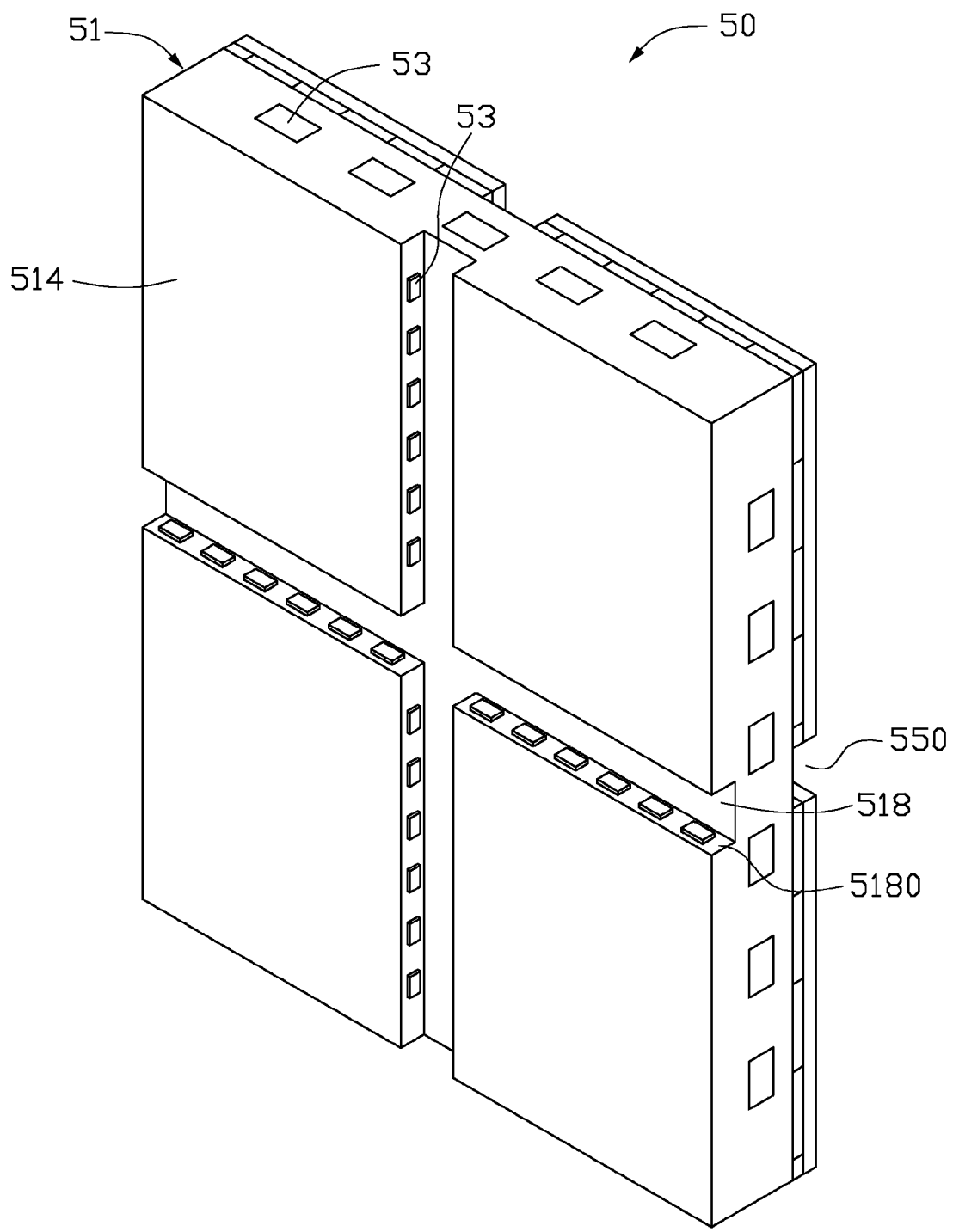
FIG. 3 is a schematic view of an illumination device, in accordance with a third embodiment.

FIG. 3 shows an illumination device 50, in accordance with the third embodiment, differing from the illumination device 30 in the inclusion of a plurality of grooves 518 defined on the light emitting surface 514 of the substrate 51 corresponding to the spaces 550, and light emitting diodes 53 are further arranged on inner side walls 5180 of the grooves 518. Therefore, light transmitting out through the light emitting surface 514 of the substrate 51 is more uniform.

Figure 4:
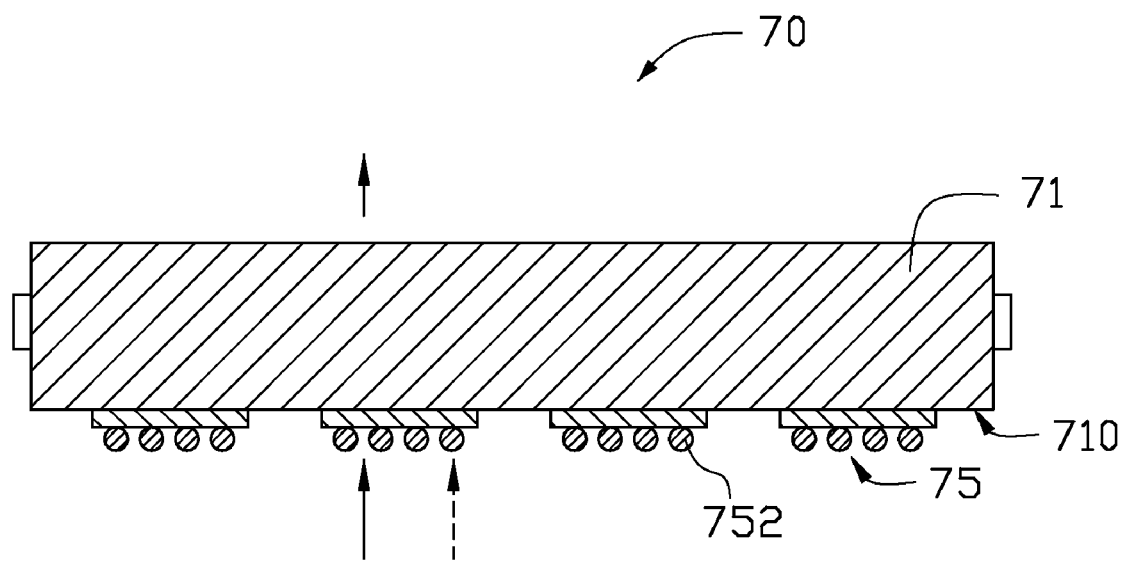
FIG. 4 is a schematic view of an illumination device, in accordance with a fourth embodiment.

FIG. 4 shows an illumination device 70, in accordance with the fourth embodiment, differing from the illumination device 10 in that the solar cell 75 includes a plurality of micro silicon spheres 752.

The micro silicon spheres 752 are spaced apart from each other on the bottom surface 710. Light incident on the silicon spheres 752 (shown by a dashed line arrow) is converted into electric energy. And light incident directly on the substrate 71 (shown by a solid line arrow) can transmit through the substrate 71. Therefore, more solar light passes through the substrate 71 to offer natural lighting.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An illumination device, comprising:
   a light-pervious substrate, the substrate having a bottom surface, a light incident surface adjacent to the bottom surface, and a light emitting surface opposite to the bottom surface;
   a solid-state light source arranged on the light incident surface for emitting light into the substrate through the light incident surface; and
   at least one solar cell arranged on the bottom surface of the substrate to absorb and convert solar energy into electric energy and supply the electric energy to the solid-state light source;
   wherein the at least one solar cell comprises a plurality of solar cells spaced from each other; and
   wherein a plurality of spaces are defined between each two solar cells, a plurality of grooves are defined in the light emitting surface spatially corresponding to the spaces, and another light source is arranged on inner side walls of the substrate in the grooves thereof.

2. The illumination device of claim 1, wherein the solid-state light source is light emitting diode.

3. The illumination device of claim 1, wherein a receiving recess is defined in the light incident surface of the substrate receiving the solid-state light source therein.

4. The illumination device of claim 1, wherein the at least one solar cell is at least one thin film solar cell having a thickness of less than 300 μm.

5. The illumination device of claim 1, wherein the solar cell is comprised of a material selected from the group consisting of silicon, subgroup III-V semiconductor compounds, copper indium gallium selenide, copper indium selenide, cadmium-tellurium, organic material and dye-sensitized material.

6. The illumination device of claim 1, wherein the solar cell comprises a plurality of spaced silicon spheres.

7. The illumination device of claim 1, wherein the substrate is made of glass or plastic.

8. The illumination device of claim 1, further comprising a transparent conductive film, arranged on the bottom surface to fix the solar cell to the substrate.

9. An illumination device comprising:
   a light-pervious plate having a first surface, a second surface at an opposite side of the plate to the first surface, and a peripheral side surface interconnected between the first surface and the second surface, the plate having a plurality of grooves defined in the second surface;
   a plurality of first point light sources arranged on the peripheral side surface for emitting light into the plate through the peripheral side surface;
   a plurality of second point light sources arranged on inner wall surfaces of the plate in the grooves for emitting light into the plate through the inner wall surfaces; and
   a plurality of spaced solar cells mounted on the first surface of the substrate for converting solar energy into electric energy, and supplying the electric energy to at least one of the first and second point light sources;
   wherein a plurality of spaces are defined between each two solar cells, and the grooves are spatially corresponding to the spaces.

10. The illumination device of claim 9, wherein a plurality of receiving recesses are defined in the peripheral side surface of the plate receiving the first point light sources therein.

* * * * *